United States Patent
Kuzmenka

(10) Patent No.: US 6,805,568 B2
(45) Date of Patent: Oct. 19, 2004

(54) ZIPPER CONNECTOR

(75) Inventor: Maksim Kuzmenka, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/460,715

(22) Filed: Jun. 12, 2003

(65) Prior Publication Data

US 2004/0018763 A1 Jan. 29, 2004

(30) Foreign Application Priority Data

Jun. 12, 2002 (EP) .............................. 02013013

(51) Int. Cl.⁷ .............................. H01R 25/00
(52) U.S. Cl. ...................... 439/285; 439/714
(58) Field of Search ................. 439/285, 284, 439/714; 24/381, 432, 205.13; 29/408, 883

(56) References Cited

U.S. PATENT DOCUMENTS

| 3,753,201 | A | | 8/1973 | Ohman |
| 4,931,021 | A | | 6/1990 | Mohan |
| 4,981,336 | A | * | 1/1991 | Mohan .................. 385/56 |
| 5,499,927 | A | | 3/1996 | Ohno et al. |

FOREIGN PATENT DOCUMENTS

FR    2 561 452 A1    9/1985

* cited by examiner

*Primary Examiner*—Alex Gilman
(74) *Attorney, Agent, or Firm*—Laurence A. Greenberg; Werner H. Stemer; Ralph E. Locher

(57) ABSTRACT

A connector arrangement comprises first conductor teeth on a first support and second conductor teeth on a second support. A slider is provided for electrically and mechanically connecting and disconnecting respective first conductor teeth on the first support to respective second conductor teeth on the second support in the manner of a zipper.

9 Claims, 2 Drawing Sheets

ZIPPER CONNECTOR

BACKGROUND OF THE INVENTION

1. Field of the Invention

The present invention relates to a connector for connecting a plurality of first contacts on a first support to a plurality of second contacts on a second support.

2. Description of the Related Art

At present, different types of pin-circuit connectors in plastic cases are used in order to connect a plurality of contacts on a first circuit part to a plurality of contacts on a second circuit part. Such traditional types of connectors are not flexible. In addition, the connection force and the disconnection force in the case of a large number of pins which have to be connected becomes too large.

SUMMARY OF THE INVENTION

It is the object of the present invention to provide a connector arrangement and a circuit part permitting for connection and disconnection with reduced force involved.

The present invention is a connector arrangement having:

first conductor teeth on a first support;

second conductor teeth on a second support;

means for electrically and mechanically connecting and disconnecting respective first conductor teeth on a first support to respective second conductor teeth on the second support in the manner of a zipper.

The present invention further provides a circuit part having:

a support; and conductor teeth provided on the support wherein the conductor teeth are designed to be electrically and mechanically connected to respective conductor teeth provided on another support in the manner of a zipper.

The present invention is based on the finding that the zipper technique, well-known from a plurality of fields of application, closing for example, can be utilized to provide connection between a plurality of contacts or pins of circuit parts such as printed circuit boards, flexible printed circuit boards and ribbon cables.

According to the invention, the contacts or pins are designed as conductor teeth or contact teeth which can have the shape of traditional zipper teeth. Thus, a conventional zipper slider can be used for closing the zipper, i.e. causing the mechanical and electrical connections between the teeth on the first and second support.

In preferred embodiments of the present invention, the conductor teeth, i.e. the contact teeth, are separated by electrically insulating teeth, for example plastic teeth, such that, electrically insulated from each other, a plurality of electrical connections between conductor teeth can be achieved. Moreover, preferably the conductor teeth and the insulating teeth are provided with a spring mechanism in order to improve the electrical contact between adjacent teeth when connected.

The present invention provides a new type of a connector by which a plurality of pins in the form of conductor teeth can be connected and disconnected with reduced force when compared to traditional connectors. Thus, according to the invention, large connection/disconnection forces occurring in traditional kinds of connectors having a large number of pins (for example more than 100), which can cause a damage to the connector or the device having the connector do not occur according to the invention.

Moreover, in normal connectors additional details are needed to exclude wrong connections such as short circuiting between pins which shall not be connected, which are not required according to the invention when conductor teeth are separated by insulating teeth. Moreover, contrary to the most traditional connector types, the connector according to the invention is elastic.

BRIEF DESCRIPTION OF THE DRAWINGS

Preferred embodiments of the present invention are described hereinafter referring to the enclosed drawings in which.

DESCRIPTION OF THE PREFERRED EMBODIMENTS

Figure 1:
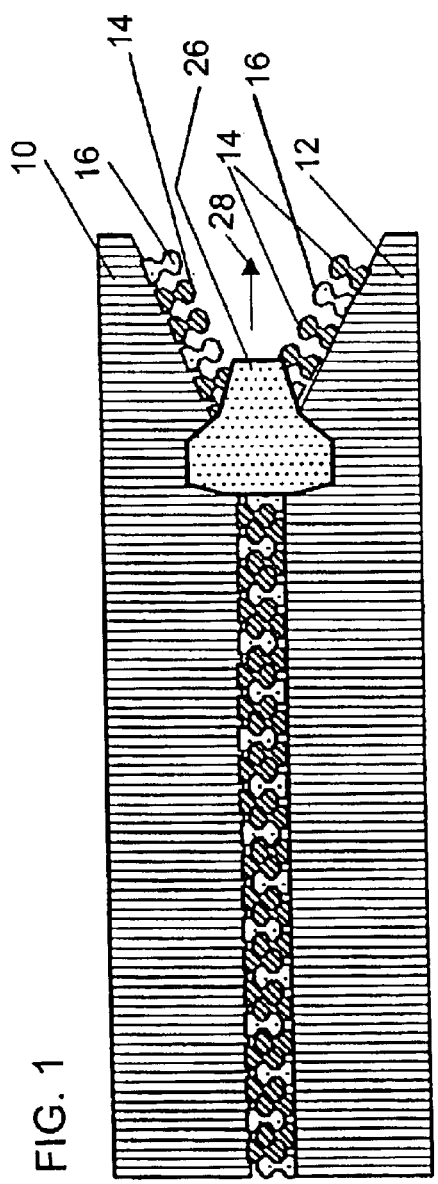
FIG. 1 shows a schematic top view of a first embodiment of a connector arrangement according to the invention.

FIG. 1 shows an embodiment of the present invention in which two ribbon cables 10 and 12 are connected via the inventive connector arrangement. A plurality of conductor teeth 14 (indicated by hatching) and insulating teeth 16 are arranged along an edge of the ribbon cable 10 so as to protrude therefrom. Similarly, a plurality of conductor teeth 14 and insulating teeth 16 are provided along an edge of the ribbon cable 12. Although not shown in FIG. 1, the respective conductor teeth 14 are electrically connected to respective conductors or conductive regions of the ribbon cables 10 and 12 as it is indicated in FIG. 3 by conductors 18.

Figure 3:
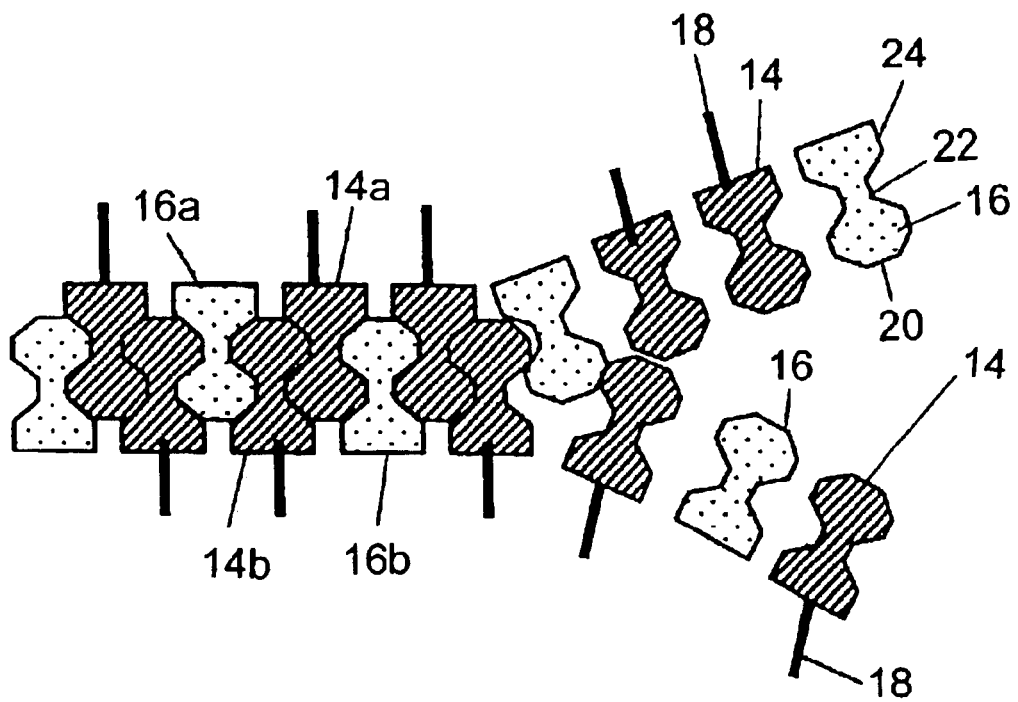
FIG. 3 shows a schematic view for illustrating the zipper mechanism used.

As it can be best seen in FIG. 3, the shapes of the conductor teeth 14 and the insulating teeth 16 are adapted to each other and can correspond in shape to the teeth of any traditional zipper. To be more specific, each tooth comprises an extended top portion 20, a narrowed middle portion 22 and an extended lower portion 24. In order to close the zipper, the teeth of the upper part thereof and the teeth of the lower part thereof are arranged dislocated with respect to each other so that the extended portions 20 of the upper part teeth can be placed into the space formed by the narrowed portions 22 of adjacent lower part teeth. To achieve such a connection, a zipper slider or zipper clasp 26 (FIG. 1) is used. The zipper slider acts like a conventional zipper slider in order to close the zipper when moved in the direction of the arrow 28 in FIG. 1. In other words, the upper teeth are engaged with the lower teeth when closing the zipper and the upper teeth are disengaged from the lower teeth when opening the zipper.

As can be seen from the left-hand portion of FIGS. 1 and 3, i.e. that portion in which the zipper is closed, a respective upper conductor tooth 14a is in contact with a respective lower conductor tooth 14b. The upper conductor tooth 14a and the lower conductor tooth 14b which are connected to each other are insulated from other upper and lower conductor teeth by an upper insulating tooth 16a and a lower insulating tooth 16b. Thus, a plurality of individual electrical connections between upper and lower conductor teeth are implemented by the provision of the insulating teeth 16. To this end, according to the embodiment shown, each third tooth is an insulating tooth and the upper part and the lower part of the zip fastener are arranged with respect to each other such that each insulating tooth of the upper part is located between two conductor teeth of the lower part and that each insulating tooth of the lower part is located between two conductor teeth of the upper part.

Figure 2:
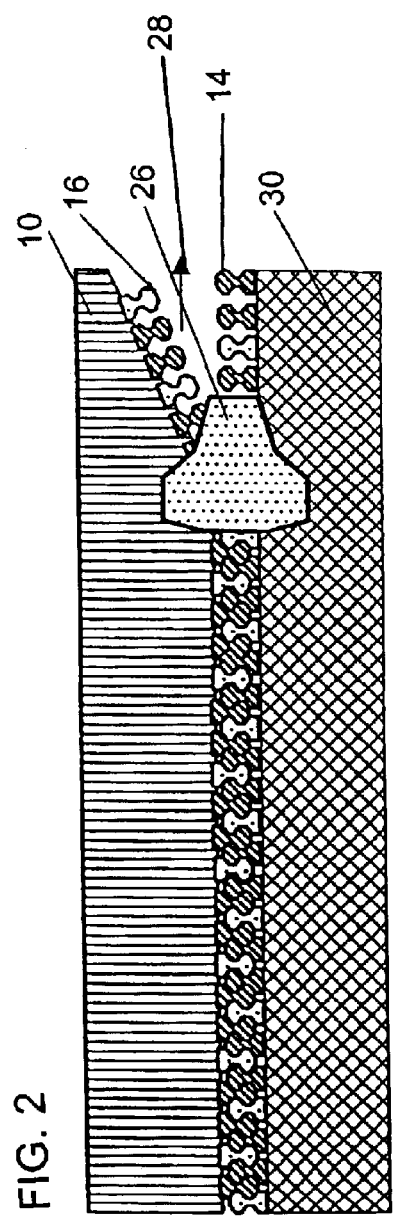
FIG. 2 shows a schematic top view of a second embodiment of a connector arrangement according to the invention.

It is clear that it will be sufficient to provide a reduced number of insulating teeth in a case in which it is not necessary to insulate each connection between two conductor teeth from the adjacent ones. The ribbon cables 10 and 12 provided with the inventive connector in the form of zipper teeth can be commonly used ribbon cables like IDE cables or SCSI cables. Moreover, the present invention is not restricted to connect two ribbon cables to each other. Rather, it is possible to connect a ribbon cable to a printed circuit board (PCE) or to connect two flexible printed circuit boards. An embodiment of the invention, in which the ribbon cable 10 is connected to a printed circuit board 30 is shown in FIG. 2. In FIG. 2, elements corresponding to that of FIG. 1 are indicated by the same reference numbers.

The supports, the teeth and/or the manner in which the teeth are attached to the supports have to be configured to allow for movement of adjacent teeth relative to each other such that the teeth provided on one support can engage the teeth on the other support. To this end, the support can be flexible, the attachment of the teeth thereto can be flexible or the teeth itself can be flexible.

Figure 4:
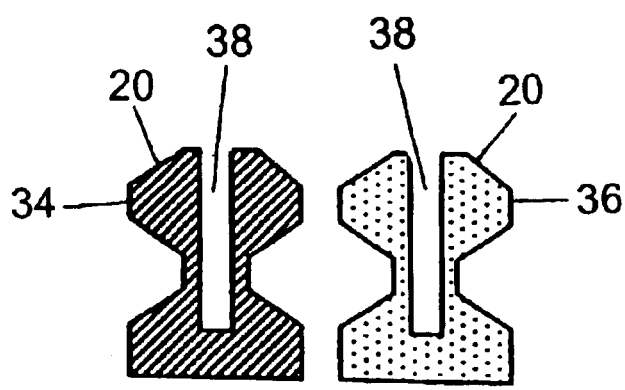
FIG. 4 shows schematic views of preferred embodiments of a conductor tooth and an insulating tooth according to the invention.

Preferred embodiments of a conductor tooth 34 and an insulating tooth 36 which are provided with a spring mechanism to improve the electrical contact between adjacent teeth when connected are shown in FIG. 4. A gap or clearance 38 is provided in the teeth 34 and 36. The gap 38 extends from the upper surface of the extended portion 20, a distance through the teeth so that, upon exerting a pressure on the extended portion 20, the portions thereof separated by the gap 38 are deflected towards each other. By this deflection, a restoring force in the opposite direction is generated. The teeth shown in FIG. 4 are configured such that a deflection as described above is caused when the zipper is closed, i.e. when the respective conductor teeth of the first part of the zipper and the second part thereof are joined together. Thus, the contact between adjacent conductor teeth is improved by the restoring force generated due to the springy construction of the teeth.

Alternatively, the same effect can be achieved by forming the teeth of an elastic material and by designing the connector such that the teeth are slightly compressed when the zipper is closed.

The present invention provides a novel technique for connecting a plurality of terminals to each other, in particular for connecting a plurality of terminals of flexible circuit parts to each other.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A connector arrangement comprising:
   first conductor teeth on a first support;
   second conductor teeth on a second support;
   means for electrically and mechanically connecting and disconnecting a respective one of said first conductor teeth on said first support to a respective one of said second conductor teeth on said second support;
   said first and second conductor teeth being provided with a spring mechanism to improve an electrical contact between adjacent conductor teeth when connected, said spring mechanism including a gap formed in each tooth between opposing contacting surfaces of said tooth, and when connected, said first and second conductor teeth being compressed by reducing said gap to produce a restoring force.

2. The connector arrangement of claim 1, further comprising electrically insulating teeth provided between respective ones of said first and second conductor teeth in order to permit, electrically insulated from each other, a plurality of electrical connections between said first and second conductor teeth.

3. The connector arrangement of claim 1, wherein said first and second conductor teeth are formed of an elastic material and are configured to be compressed when connected so that a restoring force is produced.

4. The connector arrangement of claim 1, wherein at least one of said first support and said second support are one of a printed circuit board, a flexible printed circuit board, and a ribbon cable.

5. The connector arrangement of claim 1, wherein said means for electrically and mechanically connecting and disconnecting a respective one of said first conductor teeth on said fist support to a respective one of said second conductor teeth on said second support, is a zipper.

6. A circuit part comprising:
   a support; and
   conductor teeth provided on said support, said conductor teeth being configured to be electrically and mechanically connected to respective conductor teeth provided on another support, said conductor teeth being provided with a spring mechanism to improve the electrical contact between adjacent conductor teeth when connected, said spring mechanism including a gap formed in each tooth between opposing contacting surfaces of said tooth, and when connected, said teeth being compressed by reducing said gap to produce a restoring force.

7. The circuit part of claim 6, further comprising electrically insulating teeth provided between respective ones of said conductor teeth in order to permit, electrically insulated from each other, a plurality of electrical connections between said conductor teeth of said support and said conductor teeth of said other support.

8. The circuit part of claim 6, wherein the circuit part is a printed circuit board, a flexible printed circuit board, or a ribbon cable.

9. The circuit part of claim 6, further comprising a zipper for electrically and mechanically connecting said conductor teeth on said support to respective ones of said conductor teeth provided on said other support.

* * * * *